United States Patent
Moore et al.

(10) Patent No.: US 10,784,391 B2
(45) Date of Patent: Sep. 22, 2020

(54) MULTIPLE LAYER OPTICS FOR LIGHT COLLECTING AND EMITTING APPARATUS

(71) Applicant: University of Rochester, Rochester, NY (US)

(72) Inventors: Duncan T. Moore, Fairport, NY (US); Greg R. Schmidt, Gates, NY (US)

(73) Assignee: University of Rochester, Rochester, NY (US)

( * ) Notice: Subject to any disclaimer, the term of this patent is extended or adjusted under 35 U.S.C. 154(b) by 73 days.

(21) Appl. No.: 15/372,975

(22) Filed: Dec. 8, 2016

(65) Prior Publication Data
US 2018/0166593 A1 Jun. 14, 2018

(51) Int. Cl.
*H01L 31/054* (2014.01)

(52) U.S. Cl.
CPC ...... *H01L 31/0547* (2014.12); *H01L 31/0543* (2014.12); *Y02E 10/52* (2013.01)

(58) Field of Classification Search
CPC ................................................. H01L 31/0547
See application file for complete search history.

(56) References Cited

U.S. PATENT DOCUMENTS

| | | | |
|---|---|---|---|
| 7,817,885 B1* | 10/2010 | Moore | G02B 6/0036 385/33 |
| 8,189,970 B2 | 5/2012 | Moore et al. | |
| 8,412,010 B2* | 4/2013 | Ghosh | F24S 23/30 385/31 |
| 8,498,505 B2 | 7/2013 | Moore et al. | |
| 9,036,963 B2 | 5/2015 | Moore et al. | |
| 9,239,172 B2* | 1/2016 | Peris Domingo | F24S 50/20 |
| 9,246,038 B2 | 1/2016 | Moore et al. | |
| 9,274,266 B2* | 3/2016 | Ford | G02B 6/0053 |
| 2013/0215122 A1* | 8/2013 | McCollum | G09G 3/3406 345/501 |

* cited by examiner

*Primary Examiner* — Omar R Rojas
(74) *Attorney, Agent, or Firm* — Bond, Schoeneck & King, PLLC; Joseph Noto

(57) ABSTRACT

A light guide includes a light guide layer having a transversely oriented side-end surface that forms a primary output aperture (exit) for light traveling in a forward propagation direction out of the end surface of the light guide (for, e.g., CPV applications) and, which forms a primary input aperture (entrance) for light traveling in a rearward propagation direction into the end surface of the light guide (for, e.g., illuminator applications). A light collection and concentration system includes a light guide apparatus, a light-transmitting medium layer disposed immediately adjacent the single light guide apparatus, and a light concentrator component of multiple optical array layers disposed adjacent the light transmitting medium layer, which is in optical registration with a light injection layer of the light guide apparatus.

15 Claims, 3 Drawing Sheets

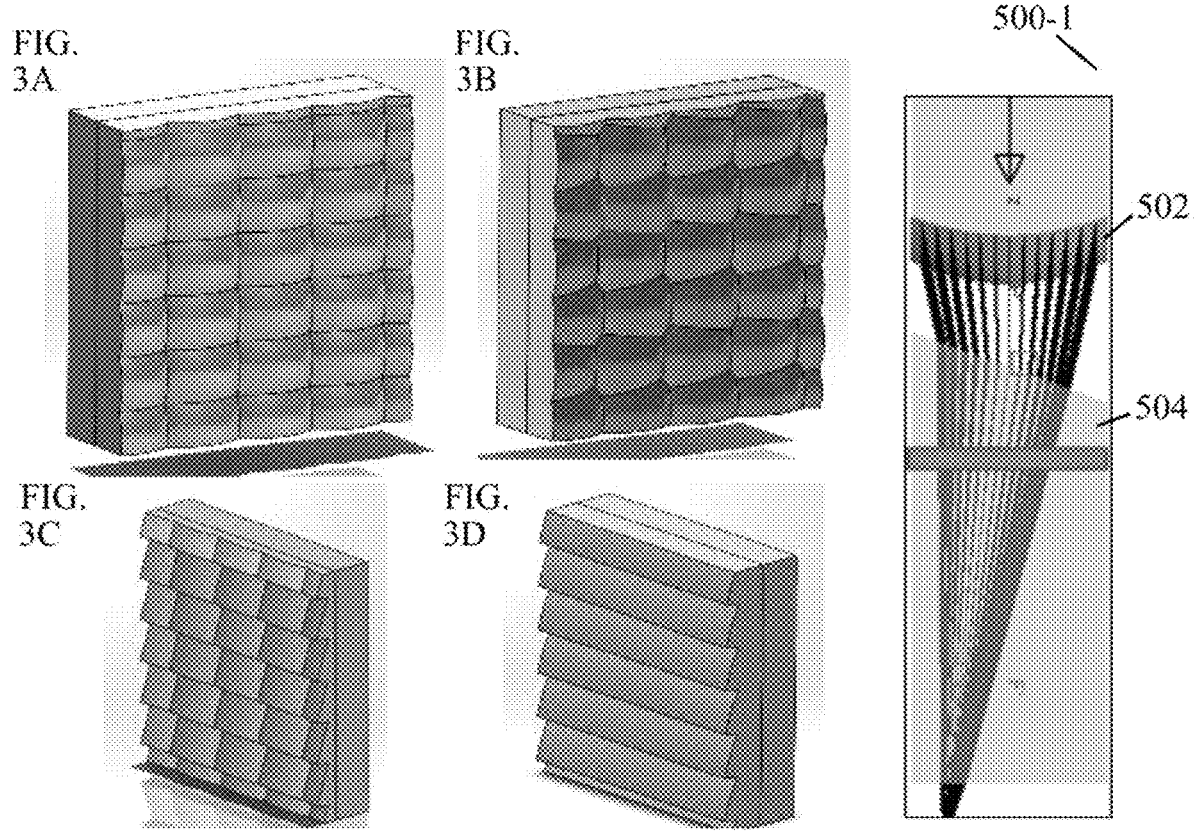

US 10,784,391 B2

MULTIPLE LAYER OPTICS FOR LIGHT COLLECTING AND EMITTING APPARATUS

GOVERNMENT FUNDING

This invention was made with government support under DE-AR0000633 awarded by the Department of Energy. The government has certain rights in the invention.

BACKGROUND

Field of the Invention

Embodiments of the invention relate generally to the field of optical light guides and, more particularly, to non-imaging, light guide concentrator and illuminator systems, methods, and applications. Even more particularly, embodiments of the invention relate to a light collection and concentration system used in a concentrated photo-voltaic (CPV) solar energy application, a non-imaging illumination system, and light guide components thereof.

Related Art

Solar energy is an important part of the renewable energy solution. Concentrated photovoltaics (CPV) have the potential to provide a source of cost effective and clean energy. By concentrating solar energy with optics, less photovoltaic (PV) material is used, reducing cost, since PVs are expensive and energy-intensive to produce compared with optical components.

In CPV applications, a general object of the system is to collect as much solar radiation as possible and concentrate that radiation as much as possible for input to a PV cell at or near the exit face. Further system objectives include maximizing primary concentrator acceptance angle, maximizing injection concentration, maximizing light guide concentration, and minimizing component and system weights and thicknesses.

In illuminator applications, a general object of the system includes generating a desired output illumination pattern at the top and/or bottom surface of the light guide from a concentrated light input at the side-end thereof.

U.S. Pat. No. 8,498,505 entitled Dimpled Light Collection and Concentration System, Components Thereof and Methods; U.S. Pat. No. 7,817,885 entitled Stepped Light Collection and Concentration System, Components Thereof, and Methods; U.S. Pat. No. 8,189,970 entitled Light Collecting and Emitting Apparatus, Method, and Applications; U.S. Pat. No. 9,036,963 entitled Light Collecting and Emitting Apparatus, Method, and Applications; and U.S. Pat. No. 9,246,038 entitled Light Collecting and Emitting Apparatus, Method, and Applications the subject matter of which is collectively incorporated by reference herein in their entirety, disclose various light collecting and emitting apparatus, methods and applications.

SUMMARY

In accordance with an aspect of the present invention, there is provided a light guide system including a light guide having a top surface and a bottom surface, characterized by an index of refraction, $n_1$, and a transversely oriented side-end surface that forms a primary aperture for light traveling into and out of the light guide, further characterized by a length dimension in an intended light propagation direction towards or away from the primary aperture; a light injection layer disposed in at least one of the top and bottom surfaces in the intended light propagation direction towards or away from the primary aperture; a light concentrating component including adjacent multiple optical array layers, disposed adjacent at least one of the top and bottom surfaces of the light guide, wherein each optical array layer includes a plurality of optical elements, wherein an optical element from one of the multiple optical array layers is paired with an optical element from an adjacent optical array layer in an intended light propagation path such that each of the paired optical elements is in optical registration with the light injection layer; and a light-transmitting medium layer characterized by an index of refraction, $n_2$, where $n_2$ is less than $n_1$, disposed between the light concentrating component at least one of the top and bottom surfaces of the light guide.

In accordance with another aspect of the present invention, there is provided a light guide apparatus, including a light guide having a top surface and a bottom surface, characterized by a transversely oriented side-end surface that forms an aperture for light traveling into and out of the light guide, further characterized by a length dimension in an intended light propagation direction towards or away from the aperture; a light injection layer disposed in the intended light propagation direction in at least one of the light guide top and bottom surfaces; and multiple adjacent layers of arrays of optical elements, disposed adjacent to at least one of the light guide top and bottom surfaces, wherein an optical element from one of the multiple layers of arrays is paired with an optical element from an adjacent layer of arrays in an intended light propagation path such that each of the paired optical elements is in optical registration with the light injection layer.

Additional features and advantages of the inventions will be set forth in the detailed description which follows, and in part will be readily apparent to those skilled in the art from that description or recognized by practicing the invention as described herein, including the detailed description which follows, the claims, as well as the appended drawings.

It is to be understood that both the foregoing general description and the following detailed description are merely exemplary of the invention, and are intended to provide an overview or framework for understanding the nature and character of the invention as it is claimed. The accompanying drawings are included to provide a further understanding of the invention, and are incorporated in and constitute a part of this specification. The drawings illustrate various embodiments of the invention, and together with the description serve to explain the principles and operation of the invention.

BRIEF DESCRIPTION OF THE DRAWINGS

FIGS. 3A-3D are perspective views of exemplary optical arrays (FIGS. 3A and 3B show lenslet arrays and FIGS. 3C and 3D show prism arrays) suitable for combination to form the light concentration component in accordance with an embodiment of the invention; and FIG. 4 is a side cross sectional view of a single paired lens/prism of adjacent multiple optical array layers of a light guide system according to an aspect of the invention.

DETAILED DESCRIPTION

Figure 1:
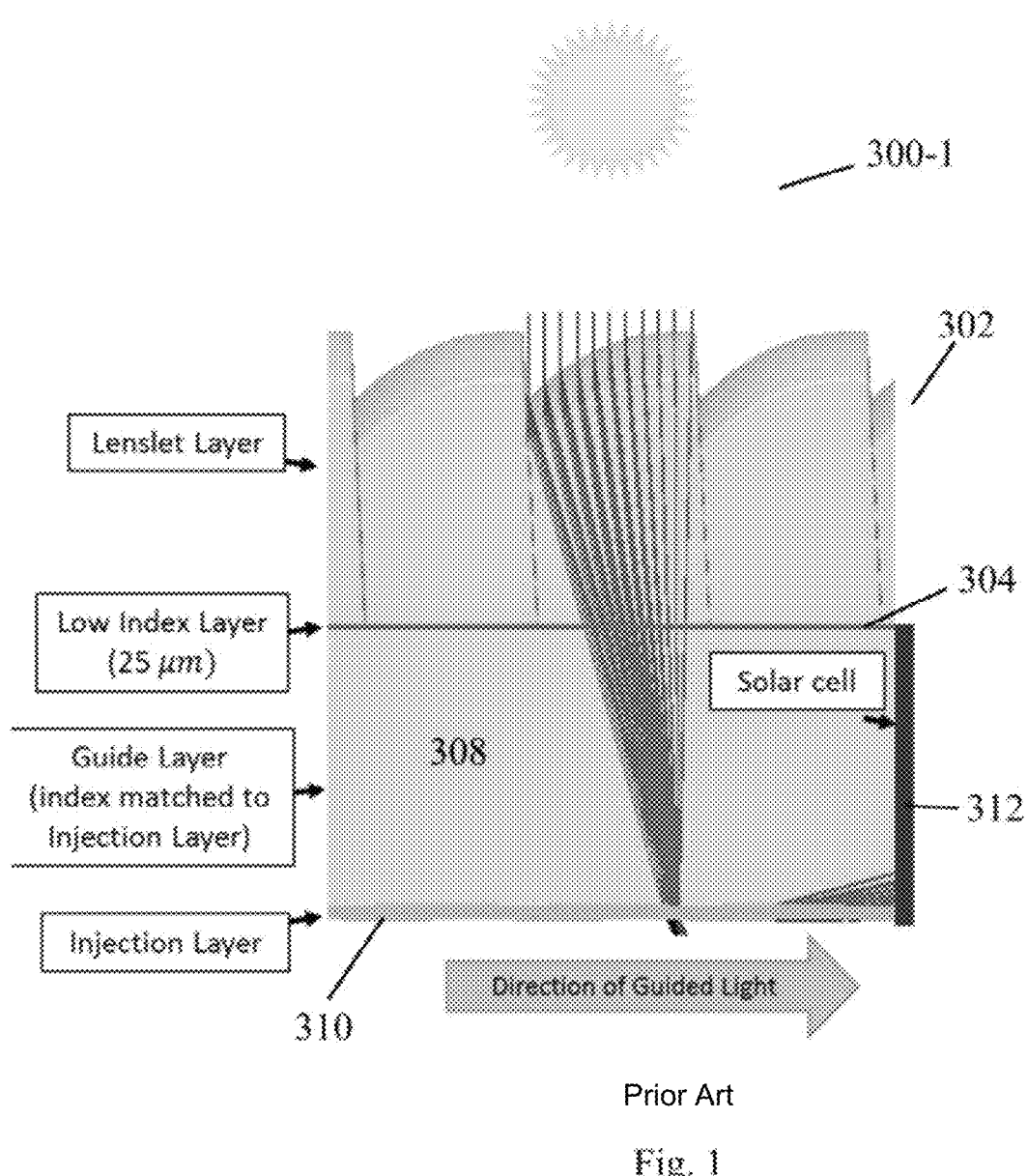
FIG. 1 shows a side cross sectional view of a prior light guide system.

Reference will now be made in detail to the present exemplary embodiments of the invention, examples of which are illustrated in the accompanying drawings. Wherever possible, the same reference numbers will be used throughout the drawings to refer to the same or like parts.

An embodiment of the invention is a component light guide and light guide system. The light guide includes a light guide layer having a top surface and a bottom surface, at least one of which is a substantially planar surface, and a transversely oriented side-end surface that forms a primary output aperture (exit) for light traveling in a forward propagation direction out of the end surface of the light guide (for, e.g., CPV applications) and, which forms a primary input aperture (entrance) for light traveling in a rearward propagation direction into the end surface of the light guide (for, e.g., illuminator applications), characterized by an index of refraction, $n_1$; a light injection layer (suitable injection layer designs include for example, train, dimple, wedged, stepped, two-step, and the like, such as, for example having a plurality of light injection elements disposed in at least one of the top and bottom surfaces and extending inwardly therefrom at an angle to the surface, wherein the light injection elements are stepped (staggered) in a forward light propagation direction in a respective first plane along lines parallel to the side-end surface); and a light concentrating component including adjacent multiple optical array layers, disposed adjacent a top surface of the light guide, wherein each optical array layer includes a plurality of optical elements, wherein an optical element from an optical array layer is paired with an optical element from an adjacent optical array layer in the intended light path such that each of the paired optical elements is in optical registration with intended light path and the light injection layer.

In a CPV system application, the aforementioned light guide system provides a way by which concentrated light from the arrays of the light concentrating component is input to and/or directed in a desired propagation direction in the light guide towards the output aperture of the light transport structure. Thus the light injection layer suitably functions to capture the primary-concentrated light spot that is for the most part normally incident into the wave guide component and redirect it, illustratively, at 90 degrees, in order for it to propagate along the length (z-direction) of the light guide towards the exit-end thereof.

An embodiment of the invention includes a light guide component. The light guide component includes a light guide layer having a top surface and a bottom surface, at least one of which is a substantially planar surface, and a transversely oriented side-end (exit) surface that forms an output aperture of the guide layer. The guide layer has an index of refraction, $n_1$, that is greater than an index of refraction, $n_2$, of a medium in contact with at least a portion of the top and/or bottom surface in order to promote light propagation by Total Internal Reflection (TIR) within the light guide. As such, the light guide may include a light-transmitting medium layer having an index of refraction, $n_2$, disposed immediately adjacent at least one of the top and bottom surfaces of the light guide. As illustrated with reference to the light guide system in FIG. 2, the guide layer has a length dimension along the z-axis; i.e., in an intended light propagation direction towards the output aperture. The guide layer may include a plurality of light injection elements disposed in the top and/or bottom surface and/or in some cases between the top and bottom surfaces.

Another and related embodiment of the invention is directed to a light collection and concentration system. The system includes a light concentrator component coupled to a single light guide such as described in the various aspects hereinabove. The system may further include a PV cell disposed adjacent the light output aperture. In various, non-limiting, alternative aspects, the light concentrator component may be any of a variety of known optical elements that can collect incident solar radiation and concentrate this incident radiation into an injection layer, which may include for example a smaller area (i.e., onto an injection element). Refractive elements (e.g., lenses), reflective elements (e.g., mirrors), and diffractive elements (e.g., gratings, holograms) are non-limiting examples of light focusing elements that may be used. According to various non-limiting aspects, a single light focusing element of the concentrator may take the form of a conventional focusing lens, a Fresnel lens, a cylindrical lens, a parabolic mirror (or segment thereof), an angle-angle concentrator, a gradient index lens, a freeform optic, a deformable surface, anamorphic lens, and other optics known in the art. In an advantageous aspect, the light concentrator component includes a refractive lens array in an alternating tiled configuration matched array of light deflecting elements, such as an array of prisms, diffracting elements, or gradient index prisms. The deflecting elements can have optical power, and or aid in correcting aberrations. In an embodiment, each paired component of the optical array layers of the concentrator is associated with a respective light injection element in the light guide.

Since it is intended that primary light propagation in the guide layer be by TIR, at least either the top or bottom surface of the guide layer will be bounded by a medium having an index of refraction that is lower than the index of the guide layer material. The location of the lower index medium immediately adjacent the top and/or bottom surface of the guide layer may depend on whether the light injection elements are in the top or bottom surface of the guide layer. Various light guide systems will be described in detail below.

The aforementioned light collection and concentration system provides a way by which light that is for the most part normally incident (i.e., within an allowable acceptance angle) on the concentrator component, and concentrated by the concentrator component, is input to and/or directed in a different, desired propagation direction in the light guide towards the output aperture of the transport structure. Thus the light injection elements suitably function to capture the concentrated light spot that is for the most part normally incident on the system and redirect it, illustratively, at 90 degrees, in order for it to propagate along the length (z-direction) of the light guide towards the exit-end thereof.

The light guide layer discussed above is in the form of a thin sheet; i.e., having a thickness, T (e.g., along the y-axis of FIG. 2), much less than the general length, L (e.g., along the z-axis of FIG. 2) of the structure and thus having a low aspect ratio defined by T/L. Additional light concentration may be provided in the light guide component and system embodiments disclosed herein, for out-coupling through the exit-end of the guide layer and, for example, into a PV cell disposed to directly receive the out-coupled light.

According to a non-limiting aspect, secondary concentration may be obtained by convergently curving at least one side-edge (y-z plane) of the light guide component towards the exit end. According to a non-limiting aspect, a secondary light concentrating optical component may be operatively coupled to (e.g., molded with, cemented to, free-space-aligned to, etc.) the exit-end of the light guide to secondarily concentrate and out-couple the light into the PV cell. The secondary concentrator may be made of the same or a different material than the guide layer. Alternatively, the exit-end itself of the guide layer may be shaped (e.g., parabolically-tapered; straight-tapered; trapezoidally-tapered; or, otherwise appropriately shaped) to integrally form the secondary concentrator in the exit-end of the guide layer. Such shapes will support all types of reflection (TIR and/or specular reflection and/or diffuse reflection) of the light propagating in the light guide.

FIG. 1 shows a side cross sectional view of a prior light guide system 300-1, that illustrates elements of a light collection and concentration system which include the lenslet array 302, light guide (light transport) layer 308, low-index TIR layer 304 disposed immediately adjacent the top surface of the guide layer and the lenslet array, light injection layer 310 and solar cell 312.

Figure 2:
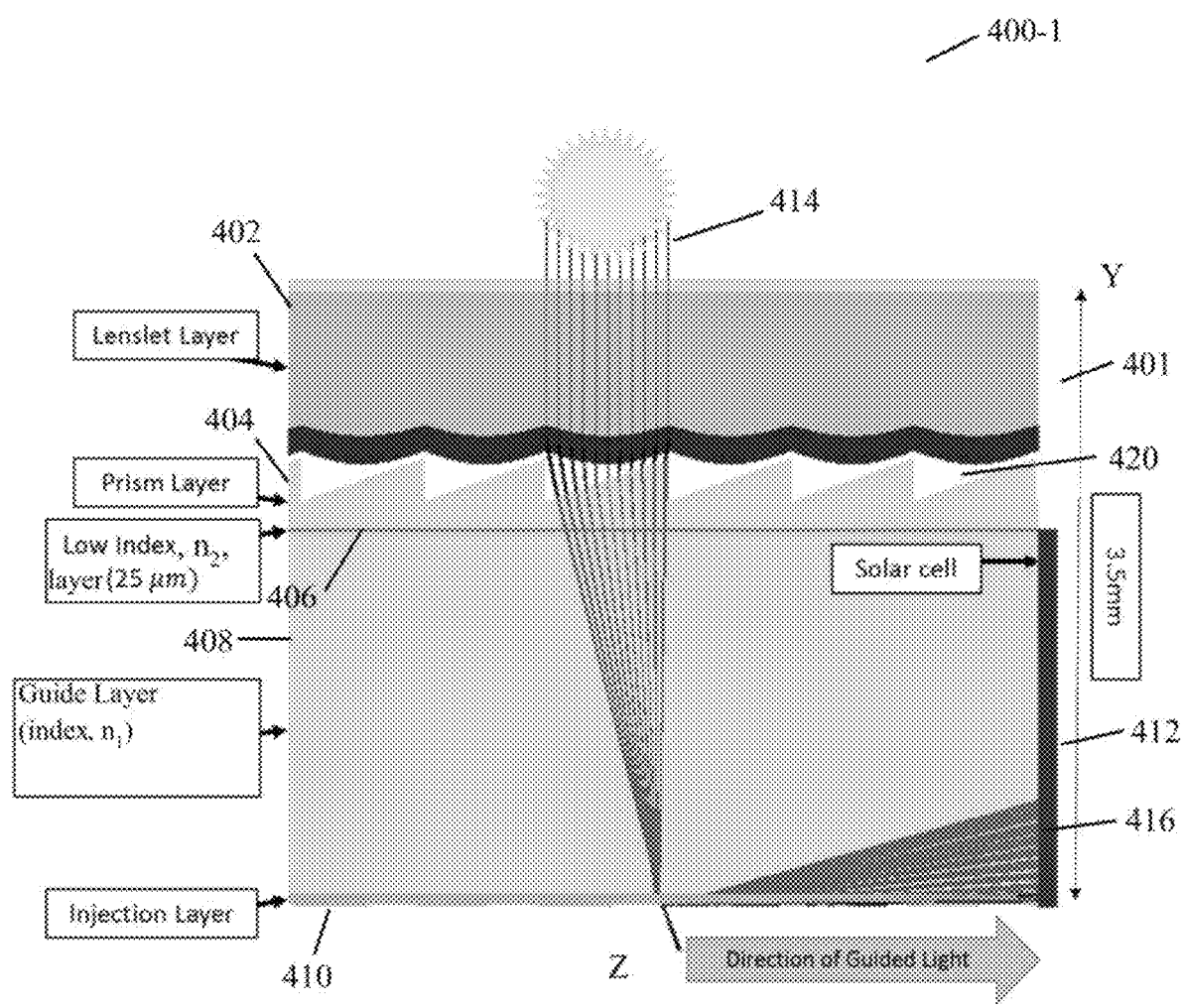
FIG. 2 shows a side cross sectional view of a light guide system according to an aspect of the invention.

FIG. 2 shows a side cross sectional view of a light guide system 400-1 according to an aspect of the invention, that illustrates elements of a light collection and concentration system which include the light concentration component 401 according to an embodiment including a lenslet array 402 adjacent a prism array 404, light guide (light transport) layer 408, low-index TIR layer 406 disposed immediately adjacent the top surface of the guide layer and the light concentration component, light injection layer 410 and solar cell 412. The separation 420 between the adjacent optical arrays can include an air gap, a low index material, or combination thereof.

In terms of a light collection and concentration system embodiment for explanatory purposes, the injection layer 410 acts to redirect incident light 414 from a (y) direction that is generally normal to the light guide to a (forward) propagation direction (z) in the light guide towards the exit window 416 of the guide layer 408.

FIGS. 3A-3D are perspective views of exemplary optical arrays suitable for combination to form the light concentration component in accordance with an embodiment. FIGS. 3A and 3B show lenslet arrays and FIGS. 3C and 3D show prism arrays.

The lens of the lenslet array can be made symmetric about its apex. The light concentrating component can be made of multiple layers of optical arrays. Accordingly, two or more adjacent optical array layers may be used in any order. Each optical array layer can be made of a plurality of optical elements known in the art. In an embodiment, the light concentrating component can be made of two or more layers of adjacent optical arrays which can be moved laterally in relation to one another, for example to track the sun as it moves across the horizon. In such an embodiment, the optical array layers can be separated by one or more air gaps. In another embodiment, the adjacent optical layers can be separated by low index materials or fluids. For instance, the lenslet layer may be cemented to the prism layer but separated therefrom by a lower-index polymer layer. A lenslet array defining a lenslet plane, disposed adjacent a top surface of the light guide with an outermost surface may have a smooth outermost surface and be curved (spherical, aspherical or anamorphic) or flat. The multiple optical array layers used in combination according to the present invention are easier/cheaper to manufacture than the offset design of a single layer, as there are no steep draft angles or complicated features, and the sag is almost half that of the offset design. When the outermost surface is flat it is easier to clean and stays cleaner longer. Additionally, a flat outermost surface is favorable for coating or bonding the flat surface to a stronger material, such as glass.

The present invention replaces a single offset apex lenslet array with a multiple layer optical array system, e.g., the first layer may be a lens array with a flat outer surface, a centered apex, and flush edges; the second layer may be a prism layer that angles the cone of light so that the focal point hits, e.g., an injection facet of the injection layer at an optimal total internal reflection (TIR) angle. According to this design three layers are pitch and alignment matched in accordance with methods known in the art. Bonding features or fiducials engineered into the design may be used to aid in aligning the three layers.

FIG. 4 illustrates a side cross sectional view of a section of a light guide system 500-1 according to an aspect of the invention, which shows a paired lens 502 of the lenslet array adjacent a prism 504 of the prism array of the light concentration component according to an embodiment. In this manner, a light focusing element of a top optical array layer can be paired with a light refracting element of an adjacent optical array layer such that the two optical elements are in the path of the light in the intended light propagation direction and the associated pairs are used to concentrate and focus the light in optical registration with the injection layer.

The light guide provides for collecting energy from multiple optical elements of multiple layer arrays and redirecting that energy to a PV cell, for example. In an embodiment, the system can be designed in a way that no downstream injection facets directly obstruct light already propagating in the guide in accordance with known methods. For a given acceptance angle, the numerical aperture should be as large as possible. Spherical aberration, coma, astigmatism, and chromatic aberration limit the realistic minimum focal spot and maximum concentration. Also, if the injection facet supports TIR, the numerical aperture will be further limited to maintain the TIR condition for all incident angles. The input aperture of the lenslets may be rectangular or anamorphic in order to allow for a small numerical aperture in one dimension in order to maintain the TIR condition at the injection facet, but allow for a large numerical aperture in another dimension.

The size of the injection facet and its angle with respect to the guide determines the injected light guided concentration. The injection facet is typically large enough to capture the focal spot for the acceptance angle of interest and be placed at an angle so that light is captured in the guiding layer. Additionally, for TIR injection facets, this angle is typically desirable to satisfy the TIR for all incident light. High concentration is achieved with shallow facet angles, but the constraints listed above calls for steeper facet angles. The two competing factors can be balanced during system optimization.

Although the component light guide and light guide system has been described above as a forward propagation system applicable to light collection and concentration for, e.g., a CPV solar system, it will be appreciated that optically the system could function in reverse. In this aspect, a concentrated source of light could be input to the guide layer at the side-end exit/entrance aperture, propagate in the (−)z direction to the injection layer and reflect up and out of the guide layer to a lenslet/prism array (or other optical condenser system) to provide illumination over an extended field.

The use of the terms "a" and "an" and "the" and similar references in the context of describing the invention (especially in the context of the following claims) are to be construed to cover both the singular and the plural, unless other-wise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening.

The recitation of ranges of values herein are merely intended to serve as a shorthand method of referring individually to each separate value falling within the range, unless otherwise indicated herein, and each separate value is incorporated into the specification as if it were individually recited herein.

All methods described herein can be performed in any suitable order unless otherwise indicated herein or otherwise clearly contradicted by context. The use of any and all examples, or exemplary language (e.g., "such as") provided herein, is intended merely to better illuminate embodiments of the invention and does not impose a limitation on the scope of the invention unless otherwise claimed. No language in the specification should be construed as indicating any non-claimed element as essential to the practice of the invention.

It will be apparent to those skilled in the art that various modifications and variations can be made to the present invention without departing from the spirit and scope of the invention. There is no intention to limit the invention to the specific form or forms disclosed, but on the contrary, the intention is to cover all modifications, alternative constructions, and equivalents falling within the spirit and scope of the invention, as defined in the appended claims. Thus, it is intended that the present invention cover the modifications and variations of this invention provided they come within the scope of the appended claims and their equivalents.

What is claimed:

1. A light guide system, comprising:
   a light guide having a top surface and a bottom surface, characterized by an index of refraction, $n_1$, and a transversely oriented side-end surface that forms a primary aperture for light traveling into and out of the light guide, further characterized by a length dimension in an intended light propagation direction towards or away from the primary aperture;
   a light injection layer comprising a plurality of light injection elements disposed in at least one of the top and bottom surfaces in the intended light propagation direction towards or away from the primary aperture;
   a light concentrating component comprising adjacent multiple optical array layers, disposed adjacent to at least one of the top and bottom surfaces of the light guide, wherein each optical array layer comprises a plurality of optical elements, wherein an optical element from one of the multiple optical array layers is paired with an optical element from an adjacent optical array layer to comprise a plurality of sets of paired optical elements in an intended light propagation path such that each set of the paired optical elements is in optical registration with a respective light injection element of the plurality of light injection elements of the light injection layer, each set having refractive properties similar to the other sets so as to produce the same concentration of light at the respective light injection element; and
   a light-transmitting medium layer characterized by an index of refraction, $n_2$, where $n_2$ is less than $n_1$, disposed between the light concentrating component and at least one of the top and bottom surfaces of the light guide, wherein the adjacent multiple optical array layers comprise a lenslet array layer and a prism array layer.

2. The light guide system of claim 1, wherein the adjacent multiple optical array layers comprise two layers.

3. The light guide system of claim 1, wherein one or more of the outermost surfaces of the adjacent multiple optical array layers is smooth.

4. The light guide system of claim 1, wherein one or more of the outermost surfaces of the adjacent multiple optical array layers is flat.

5. The light guide system of claim 1, wherein the optical elements have curvature in two dimensions.

6. The light guide system of claim 5, wherein the curvatures are equal.

7. The light guide system of claim 1, wherein the adjacent multiple optical array layers are laterally moveable with respect to each other.

8. The light guide system of claim 1, wherein the adjacent multiple optical array layers are separated by at least one air gap or medium having an index of refraction less than that of the index of refraction of the optical elements.

9. The light guide system of claim 1, further comprising a photo-voltaic cell in optical alignment with the primary aperture.

10. A light guide apparatus, comprising:
    a light guide having a top surface and a bottom surface, characterized by a transversely oriented side-end surface that forms an aperture for light traveling into and out of the light guide, further characterized by a length dimension in an intended light propagation direction towards or away from the aperture;
    a light injection layer comprising a plurality of light injection elements disposed in the intended light propagation direction in at least one of the light guide top and bottom surfaces; and
    multiple adjacent layers of arrays of optical elements, disposed adjacent at least one of the light guide top and bottom surfaces, wherein an optical element from one of the multiple layers of arrays is paired with an optical element from an adjacent layer of arrays to comprise a plurality of sets of paired optical elements in an intended light propagation path such that each set of the paired optical elements is in optical registration with a respective light injection element of the plurality of light injection elements of the light injection layer, each set having refractive properties similar to the other sets so as to produce the same concentration of light at the respective light injection element, wherein the adjacent multiple optical array layers comprise a lenslet array layer and a prism array layer.

11. The light guide apparatus of claim 10, wherein the multiple adjacent layers of arrays of optical elements comprise two.

12. The light guide apparatus of claim 10, wherein the multiple adjacent layers of arrays of optical elements are laterally moveable with respect to each other.

13. The light guide apparatus of claim 10, wherein the multiple adjacent layers of arrays of optical elements are separated by at least one air gap or medium having an index of refraction less than that of the index of refraction of the optical elements.

14. The light guide apparatus of claim 10, wherein one or more of the outermost surfaces of the multiple adjacent layers of arrays of optical elements is smooth.

15. The light guide apparatus of claim 10, wherein one or more of the outermost surfaces of the multiple adjacent layers of arrays of optical elements is flat.

* * * * *